Nov. 3, 1959 A. HAHNEL 2,911,596

FREQUENCY MULTIPLIER

Filed June 11, 1957

INVENTOR,
ALWIN HAHNEL.

BY Harry M. Saragovitz
ATTORNEY.

United States Patent Office 2,911,596

Patented Nov. 3, 1959

2,911,596

FREQUENCY MULTIPLIER

Alwin Hahnel, Little Silver, N.J., assignor to the United States of America as represented by the Secretary of the Army Application June 11, 1957, Serial No. 665,103

5 Claims. (Cl. 331—174)

(Granted under Title 35, U.S. Code (1952), sec. 266)

The invention described herein may be manufactured and used by or for the Government for governmental purposes, without the payment of any royalty thereon.

This invention relates to frequency spectrum generators and more particularly to frequency multipliers wherein a high degree of multiplication is desired at a prescribed frequency.

In my copending application Serial No. 390,265, filed November 4, 1953, and issued as Patent No. 2,816,227, there is described a frequency multiplier which utilizes a single triode tube having two resonant circuits in the plate circuit thereof and a piezoelectric crystal in the grid circuit thereof. One resonant plate circuit is tuned to the fundamental oscillation frequency generated by the crystal and the other resonant plate circuit is tuned substantially to a prescribed multiple of the fundamental oscillation frequency. With such an arrangement, two simultaneous self-excited oscillations are generated, one at the frequency of the piezoelectric crystal and the other at a preselected frequency which is very close to a desired multiple frequency harmonically related to the fundamental frequency. As described in the aforementioned application, the preselected oscillation frequency is periodically generated at the fundamental frequency such that the initial cycle of the periodic preselected frequency oscillations have the same relative phase. With the output thus periodically phase-controlled by the fundamental frequency, the output frequency spectrum contains only harmonics of the crystal stabilized fundamental frequency at which the phase-controlled section of the oscillator is keyed. As long as the fundamental frequency plate resonant circuit is tuned precisely to the crystal frequency, such circuits are capable of providing a desired multiple frequency output having an amplitude much greater than the unwanted adjacent harmonics. However, if for any reason the fundamental frequency plate resonant circuit should drift slightly from the crystal frequency, then the amplitude of the unwanted adjacent harmonics will be greater than the amplitude of the desired output harmonic and thus limit the spectrum over which the circuit may effectively operate as a multiplier.

It is therefore an object of the present invention to provide an improved frequency multiplier circuit wherein such limitations are overcome.

It is another object of the present invention to provide a frequency multiplier circuit in which the selection of a high order multiplication factor is readily accomplished by tuning of a single resonance circuit.

In accordance with the present invention, there is provided a vacuum tube having at least a plate, a grid and a cathode. Included is a piezoelectric crystal in circuit with the grid and plate and adapted to generate a fundamental frequency, and means connected across said crystal for maintaining self-excited oscillations at the fundamental frequency. Also included is a resonant circuit which is tuned to a preselected frequency substantially equal to a prescribed harmonic of the fundamental frequency and which is coupled to the grid and plate of the vacuum tube whereby there is produced self-excited oscillations at the preselected frequency. The fundamental and preselected frequency are simultaneously generated whereby the preselected frequency oscillation is keyed such that its phase is periodic at the fundamental frequency.

For a better understanding of the invention together with other and further objects thereof, reference is had to the following description taken in connection with the accompanying drawings in which.

Figure 1:
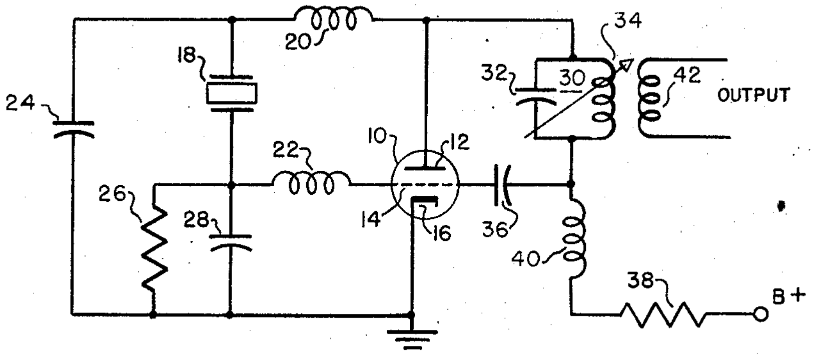
Fig. 1 is a schematic diagram of the frequency multiplier.

Referring now to Fig. 1 of the drawing there is shown at 10 an electron discharge device having an anode or plate 12, a control grid 14, and a cathode 16 which is connected to ground. A piezoelectric crystal 18 adapted to resonate at a fundamental frequency $f_1$ is connected between plate 12 and grid 14 through respective choke coils 20 and 22. A capacitor 24 is connected between ground and the junction of choke coil 20 and one terminal of piezoelectric crystal 18. The junction of chocke coil 22 and the other terminal of piezoelectric crystal 18 is connected to ground through the parallel arrangement of resistor 26 and capacitor 28. Connected also to plate 12 is one terminal of a tunable resonant circuit 30 comprising the parallel arrangement of a capacitor 32 and an inductor 34, either of which may provide the tunable element of the resonant circuit. The other terminal of resonant circuit 30 is coupled to grid 14 through capacitor 36. B+ is applied to plate 12 through resistor 38 and inductor 40 which are in series connection with resonant circuit 30 and anode 12. Resonant circuit 30 is conventionally coupled to an output circuit 42 which, as explained hereinbelow, provides an output of only the desired multiple output frequency $f_0=nf_1$. The values of capacitor 32 and inductor 34 are chosen such that resonant circuit 30 may be tuned over a range of frequencies which are harmonically related to the fundamental frequency $f_1$.

Resonant circuit 30 is tuned to a preselected frequency F close to or approximately equal to $nf_1$, symbolically noted as $F \doteq nf_1$, where $nf_1$ is the desired multiple $f_0$ of the fundamental frequency generated by piezoelectric crystal 18. To distinguish between preselected frequency F and the desired multiple output frequency $f_0=nf_1$, $f_0$ will hereinafter be referred to as the output frequency. The circuit shown in Fig. 1 provides for simultaneous self-excitation of oscillations at two independent frequencies, one of which is the crystal frequency $f_1$ and the other is the preselected frequency $F \doteq nf_1$. The fundamental requirement for such simultaneous oscillation in a one tube stage is that there must be a relatively large frequency ratio, greater than 10 to 1, for example, between the two frequencies. The values of choke coils 20 and 22 are chosen such that they present a very high impedance to the preselected frequency $F \doteq nf_1$, but a relatively low impedance to the crystal generated fundamental frequency $f_1$. The value of capacitor 36 is chosen such that it presents a high impedance at the fundamental frequency $f_1$ in order to prevent loading of the crystal circuit by the tuned circuit 30. The value of capacitors 24 and 28 are chosen such that the capacitance ratio therebetween is sufficient to maintain oscillations at the crystal frequency $f_1$. Oscillations at preselected frequency F are maintained by the interelectrode capacitances between anode 12, grid 14 and cathode 26.

Figure 2:
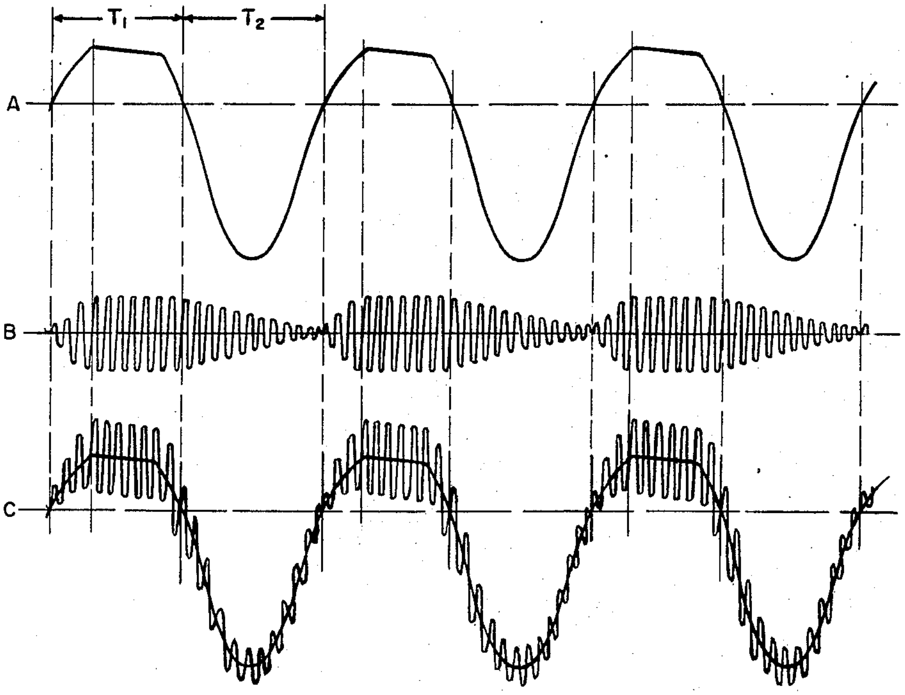
Figs. 2 and 3 are explanatory diagrams.
Figure 3:
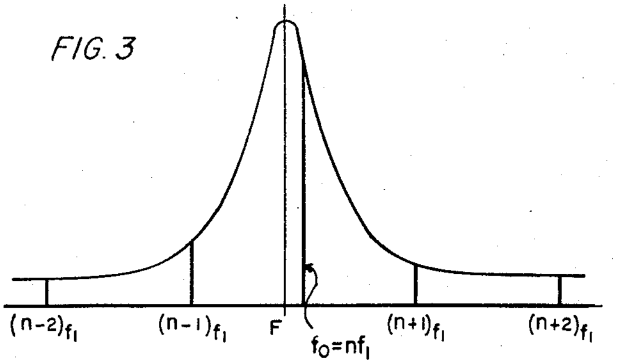

In considering the operation of the frequency multiplier reference is made to Figs. 2 and 3. Curve A of Fig. 2 represents the fundamental oscillation frequency $f_1$ generated by the piezoelectric crystal 18 and which is applied to grid 14 of tube 10. The crystal oscillator section has its feedback determined by the ratio between the values of capacitors 24 and 28. The frequency $f_1$ is arbitrarily chosen to provide the fundamental frequency to which any one of the selected output frequencies $f_0$ derived from output circuit 42 is harmonically related. The grid voltage shown in curve 2A may be considered to produce a bias such that there is provided a regenerative period and a degenerative period for the preselected oscillation frequency $F \doteq nf_1$. The regenerative period of the preselected frequency F occurs during the positive half cycle of the fundamental frequency oscillation $f_1$, and during this period the amplitude of the preselected oscillations F increase. With an increase in amplitude a considerable amount of grid current is drawn during the regenerative period until a nonlinear range of the tube 10 characteristic becomes involved so that a substantial constant amplitude condition for the preselected frequency oscillation F is reached. The regenerative period is represented in curve 2A by the duration $T_1$. The constant amplitude condition will be maintained until the beginning of the degenerative period where the oscillations at preselected frequency F decay as represented by the duration $T_2$. This is so because the negative voltage portion of the wave of curve 2A reduces the transconductance of tube 10 below the value of which the high frequency circuit is oscillatory. Thus the degenerative period occurs during the negative half cycle of the fundamental oscillation of frequency $f_1$ and during this degenerative period the preselected frequency oscillation F is quenched due to the decrease in the transconductance of the oscillator tube 10. This provides a positive damping of the prescribed frequency F oscillation. In order to prevent the output from being that of a carrier that is amplitude modulated at the fundamental frequency $f_1$, it is necessary that the oscillations F be periodic at $f_1$. This requirement is most easily fulfilled if the oscillations F are made to be substantially smaller than the inherent harmonics of the fundamental oscillation at the beginning of the next regenerative period. To provide the required periodicity, the oscillations at preselected frequency F from resonant tuned circuit 30 will be started with the same phase at the beginning of each regenerative period so that, in effect, the preselected oscillation frequency F is keyed and phase-contolled such that its output waveform is periodic at the frequency $f_1$ which is the fundamental frequency common to all available channel frequencies. Figs. 2B and 2C show the output of resonant circuit 30 and the combined fundamental and preselected frequency oscillations, respectively. To obtain a crystal stabilized output frequency $f_0=nf_1$, the resonant circuit 30 should be tuned close to the desired output frequency. With preselected frequency F in the vicinity of the desired output multiple frequency $f_0=nf_1$, the output energy from the higher frequency resonant circuit 30 is concentrated at the desired output multiple frequency. As shown in Fig. 3 there appears a frequency spectrum wherein the amplitude of the desired multiple output frequency $f_0=nf_1$ is a maximum only if preselected frequency F is in the close vicinity of $nf_1$. The frequency F does not appear in the output circuit inasmuch as oscillations at this frequency are not continuous over more than one fundamental period as explained hereinabove. By such an arrangement, the output frequency is an exact harmonic or multiple of the fundamental frequency. This is a well known principle and it is believed that no further description is necessary. Of course, if it is desired to shift the multiple output frequency, then the resonant circuit 30 must be tuned to a frequency in the vicinity of the newly desired multiple frequency output. With the circuit shown in Fig. 1 it has been found that the unwanted adjacent harmonics may be suppressed to 40 db below the desired harmonic output $f_0=nf_1$ by tuning resonant circuit 30 exactly to the desired multiple frequency output.

While there has been described what is at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A frequency multiplier comprising a vacuum tube having at least a plate, a grid and a cathode, means including a piezoelectric crystal in circuit with said plate and grid for generating at said grid self-excited oscillations at a fundamental frequency, a resonant circuit tuned to a preselected frequency substantially equal to a prescribed multiple of said fundamental frequency, said resonant circuit being coupled to said grid and plate whereby there is produced at said grid self-excited oscillations at said preselected frequency, and means in circuit with said piezoelectric crystal for periodically generating said preselected frequency oscillation whereby the output waveform of the preselected frequency oscillation is keyed such that its phase is periodic at said fundamental frequency.

2. A frequency multiplier comprising a vacuum tube having at least a plate, a grid and a cathode, a piezoelectric crystal in circuit with said grid and said plate and adapted to generate a fundamental frequency, means connected across said crystal for maintaining at said grid self-excited oscillations at said fundamental frequency, a parallel resonant circuit tuned to a preselected frequency substantially equal to a prescribed multiple of said fundamental frequency, said parallel resonant circuit being coupled to said grid and said plate whereby there is produced at said grid self-excited oscillations at said preselected frequency, said fundamental frequency and said preselected frequency being simultaneously generated whereby the output waveform of the preselected frequency oscillation is keyed such that its phase is periodic at said fundamental frequency.

3. The frequency multiplier in accordance with claim 2 and further including a first inductor connected between one terminal of said crystal and said plate, a second inductor connected between the other terminal of said crystal and said grid, the values of said inductors being chosen such that the respective impedance thereof is relatively high for said preselected frequency and relatively low for said fundamental frequency.

4. A frequency multiplier comprising a vacuum tube having at least a plate, a grid and a cathode, a piezoelectric crystal adapted to operate at a fundamental frequency, said crystal having one terminal connected to said plate through a first inductor and the other terminal connected to said grid through a second inductor, discrete feedback capacitors connected between said terminals and said cathode whereby self-excited oscillations are maintained at said fundamental frequency, a parallel resonant circuit tuned to a preselected frequency substantially equal to a prescribed multiple of said fundamental frequency, said resonant circuit being coupled to said grid and said plate whereby there is generated self-excited oscillations at said preselected frequency, said fundamental frequency and said preselected frequency being simultaneously generated whereby the preselected frequency oscillation is keyed by said fundamental frequency such that the output waveform of said preselected frequency is periodic at said fundamental frequency.

5. The frequency multiplier in accordance with claim 4 wherein one terminal of the parallel resonant circuit is connected to said plate the other terminal of said resonant circuit is capacitively coupled to said grid, the value of the coupling capacitor being chosen such that it presents a relatively high impedance at the fundamental frequency.

References Cited in the file of this patent

UNITED STATES PATENTS

| | | |
|---|---|---|
| 2,288,486 | Rivlin | June 30, 1942 |
| 2,354,262 | Hershberger | July 25, 1944 |
| 2,570,840 | O'Brien | Oct. 9, 1951 |